United States Patent [19]
Farrell et al.

[11] Patent Number: 5,517,623
[45] Date of Patent: May 14, 1996

[54] FLEXIBLE ENTRY LEVEL OR ADVANCED LEVEL COMPUTER SYSTEM

[75] Inventors: Anthony E. Farrell, Stewartville; Randall J. Fuhrman; Kenneth K. Gerzsenyi, both of Rochester; John L. Regehr, Stewartville, all of Minn.

[73] Assignee: International Business Machines Corporation, Armonk, N.Y.

[21] Appl. No.: 626,927

[22] Filed: Dec. 13, 1990

Related U.S. Application Data

[63] Continuation of Ser. No. 190,730, Dec. 13, 1990, abandoned.

[51] Int. Cl.$^6$ ................................................ H05K 1/14
[52] U.S. Cl. .................... 395/281; 361/683; 364/927.92; 364/929.2; 364/929.4; 364/929.5; 364/929.61; 364/929.71; 364/DIG. 2
[58] Field of Search .................... 364/200, 900; 361/398, 400, 401, 409, 410, 412, 413

[56] References Cited

U.S. PATENT DOCUMENTS

| | | | |
|---|---|---|---|
| 2,999,997 | 9/1961 | Tuckel | 339/17 |
| 3,925,710 | 12/1975 | Ebert | 317/100 |
| 4,079,440 | 3/1978 | Ohnuma et al. | 361/409 |
| 4,200,865 | 4/1980 | Morioka et al. | 361/409 |
| 4,220,382 | 9/1980 | Ritchie et al. | 339/17 |
| 4,237,541 | 12/1980 | Wells | 364/900 |
| 4,250,563 | 2/1981 | Struger | 364/900 |
| 4,257,095 | 3/1981 | Nodir | 364/200 |
| 4,281,361 | 7/1981 | Patz et al. | 361/401 |
| 4,384,755 | 5/1983 | Perretta | 361/410 |
| 4,401,351 | 8/1983 | Record | 361/415 |
| 4,453,211 | 6/1984 | Askinazi | 364/200 |
| 4,471,427 | 9/1984 | Harris | 364/200 |
| 4,477,862 | 10/1984 | Gonzales | 361/393 |
| 4,488,354 | 12/1984 | Chan et al. | 29/830 |
| 4,490,755 | 12/1984 | Quan | 361/400 |
| 4,498,717 | 2/1985 | Reimer | 339/17 LM |
| 4,514,786 | 4/1985 | Charruau | 361/412 |
| 4,542,441 | 9/1985 | Perretta | 361/412 |
| 4,556,958 | 12/1985 | Ugan | 361/401 |
| 4,604,689 | 4/1983 | Burger | 364/200 |

(List continued on next page.)

OTHER PUBLICATIONS

"Computer Dictionary and Handbook", Charles J. Sippl, First Edition Third Printing, Howard W. Sams & Co, Indianapolis, 1967.
"Computer Information Processing & Telecommunications", Second Ed., Jerry M. Rosenberg, John Wiley & Sons, Inc., 1987.
IBM Technical Disclosure Bulletin vol. 28, No. 4, Sep. 1985, pp. 1410–1411.

*Primary Examiner*—Christopher B. Shin
*Attorney, Agent, or Firm*—Curtis G. Rose; Roy W. Truelson

[57] ABSTRACT

A system backplane has a pair of dual purpose connectors and a system bus controller. A shared resource card has a pair of connectors and a shared resource, such as memory. In an entry level system, the connectors on the shared resource card mate with the dual purpose connectors on the system backplane, connecting a system bus from the system bus controller to the shared resource. There are no unused expansion slots on the backplane. To form an advanced level system, an expansion backplane having mating connectors is inserted between the system backplane and the shared resource card. The expansion backplane allows the system bus to pass through from the system backplane to the shared resource card. The expansion backplane has an expansion bus controller, an expansion bus, and expansion slots. The expansion bus is connected to the expansion bus controller and to the expansion slots. The expansion bus is also connected to the shared resource on the shared resource card. The shared resource card also has a bus interface, which connects the expansion bus to the system bus. In an alternative embodiment, the expansion bus controller and the bus interface are contained on the system backplane instead of on the expansion backplane and the share shared resource card, respectively. The system backplane also contains a limited number of expansion slots.

11 Claims, 5 Drawing Sheets

U.S. PATENT DOCUMENTS

| | | | |
|---|---|---|---|
| 4,658,333 | 4/1987 | Grimes | 361/413 |
| 4,703,394 | 10/1987 | Petit et al. | 361/413 |
| 4,704,599 | 11/1987 | Kimmel et al. | 361/413 |
| 4,744,006 | 5/1988 | Duffield | 361/413 |
| 4,777,615 | 10/1988 | Potash | 361/413 |
| 4,853,831 | 8/1989 | Tsuchiya | 361/401 |

FLEXIBLE ENTRY LEVEL OR ADVANCED LEVEL COMPUTER SYSTEM

This application is a continuation of application Ser. No. 07/190,730 filed Dec. 13, 1990, abandoned.

FIELD OF THE INVENTION

This invention relates to the data processing field. More particularly, this invention is a flexible computer system capable of being configured as an entry level system or an advanced level system.

BACKGROUND OF THE INVENTION

Each user of a computer system has specific requirements for his system. Each user wants his system to be perfectly tailored to his present and future needs, at the lowest possible cost. One user may want a low cost entry system that is expandable when his needs change. Another user may want a higher cost advanced level computer system. The problem computer designers face is in designing a system that is flexible enough to satisfy both an entry level user and an advanced level user at the lowest possible cost to both users.

The most common approach computer designers have taken to solve the above problem is to have a backplane with several expansion slots. An advanced level system would have several expansion boards plugged into these expansion slots. An entry level system would have no or just a few boards plugged into these expansion slots. As the entry level system user's needs changed, he could plug in additional expansion boards into the expansion slots.

Although the above approach provides a system flexible enough to satisfy both an entry level and advanced level user, it does not do so at the lowest possible cost to both users. The entry level user is paying for a backplane with several expansion slots that he may never use. Unused expansion slots are inefficient and are a waste of cost and space.

SUMMARY OF THE INVENTION

It is a principal object of the invention to provide a flexible computer system capable of satisfying an entry level or advanced level user at the lowest possible cost.

It is another object of the invention to eliminate unused expansion slots on a system backplane while still providing expansion capabilities.

These and other objects are accomplished by the flexible entry level or advanced level computer system disclosed herein.

A system backplane has a pair of dual purpose connectors and a system bus controller. A system bus connects the system bus controller to one of the connectors. A shared resource card has a pair of connectors and a shared resource, such as memory. The system bus connects the shared resource to one of the connectors on the shared resource card. To make an entry level system, the connectors on the shared resource card mate with the dual purpose connectors on the system backplane. There are no unused expansion slots on the backplane.

When the entry level user wants to expand his system to an advanced level system, he unplugs the shared resource card from the system backplane. He then plugs a expansion backplane into the dual purpose connectors on the system backplane. He then plugs the shared resource card into a second pair of connectors on the expansion backplane. The expansion backplane allows the system bus to pass through from the system backplane to the shared resource card. The expansion backplane has an expansion bus controller, an expansion bus, and expansion slots. The expansion bus is connected to the expansion bus controller and to the expansion slots. The expansion bus is also connected to the shared resource on the shared resource card. The shared resource card also has a bus interface, which connects the expansion bus to the system bus.

In an alternate embodiment, the expansion bus controller and the bus interface are contained on the system backplane instead of on the expansion backplane and the shared resource card, respectively. The system backplane also contains a limited number of expansion slots.

DESCRIPTION OF THE PREFERRED EMBODIMENT

Figure 1A:
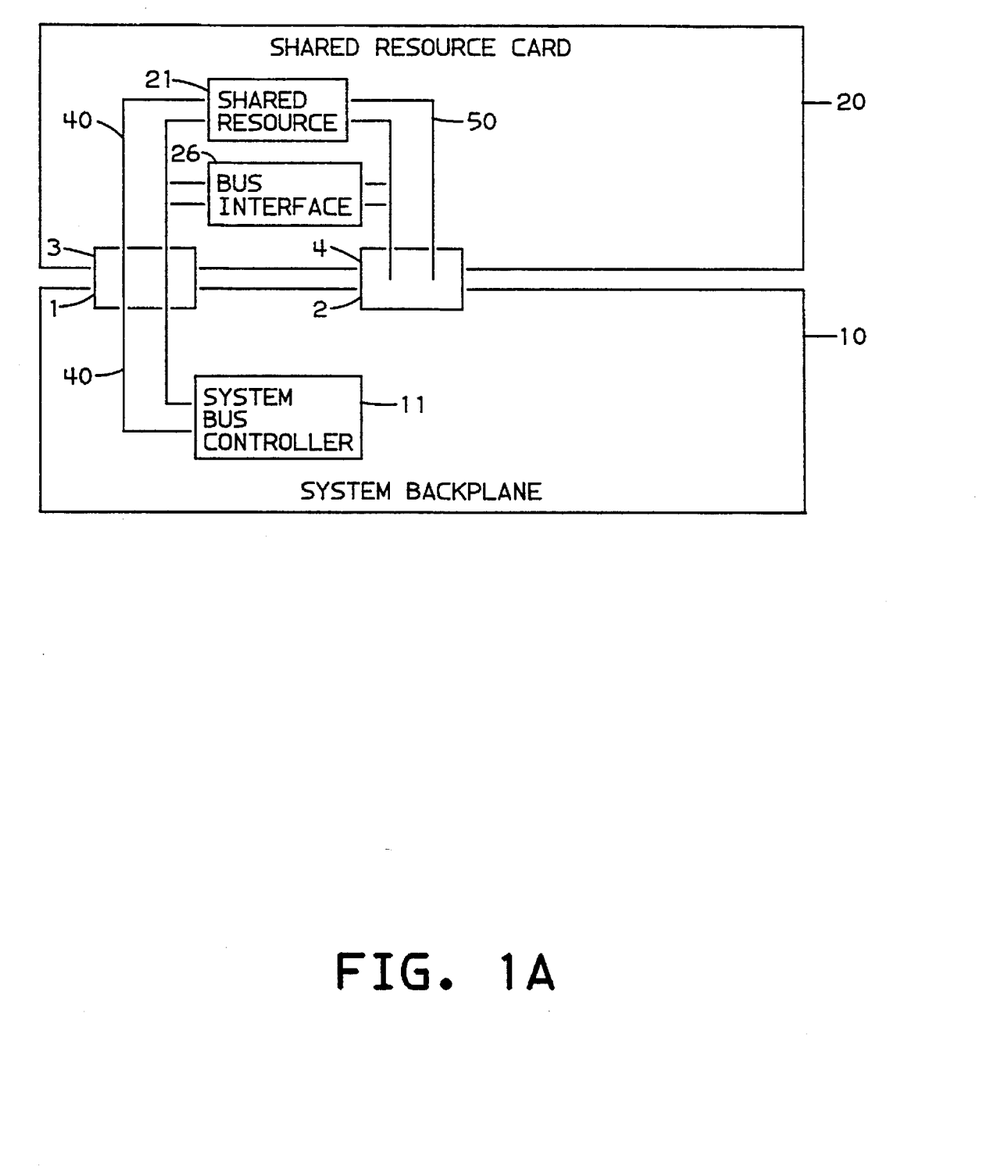
FIG. 1A shows a functional block diagram of the entry level computer system of the preferred embodiment.

FIG. 1A shows a functional block diagram of the entry level computer system of the preferred embodiment. System backplane 10 contains dual purpose connectors 1 and 2, system bus controller 11, and system bus 40. System bus 40 connects system bus controller 11 with connector 1. In the preferred embodiment, system backplane 10 is part of the IBM 5363 system, although it could be the backplane for any computer system.

Shared resource card 20 contains connectors 3 and 4 and shared resource 21. In the preferred embodiment, shared resource 21 is memory, although it could be any shared resource, such as an additional bus controller. Note that to make an entry level computer system, shared resource card 20 is plugged into system backplane 10. Specifically, dual purpose connectors 1 and 2 on system backplane 10 mate with connectors 3 and 4, respectively, on shared resource card 20. Note that in the entry level system of FIG. 1A, system bus 40 connects system bus controller 11 on system backplane 10 with shared resource 21 on shared resource card 20 via connectors 1 and 3.

Expansion bus 50 connects shared resource 21 with connector 4 on shared resource card 20. Connector 2 on system backplane 10 terminates expansion bus 50. No expansion bus controller is shown in the entry level system. The effect of this termination and lack of an expansion bus controller is that expansion bus 50 is not active in the entry level system of FIG. 1A.

Figure 1B:
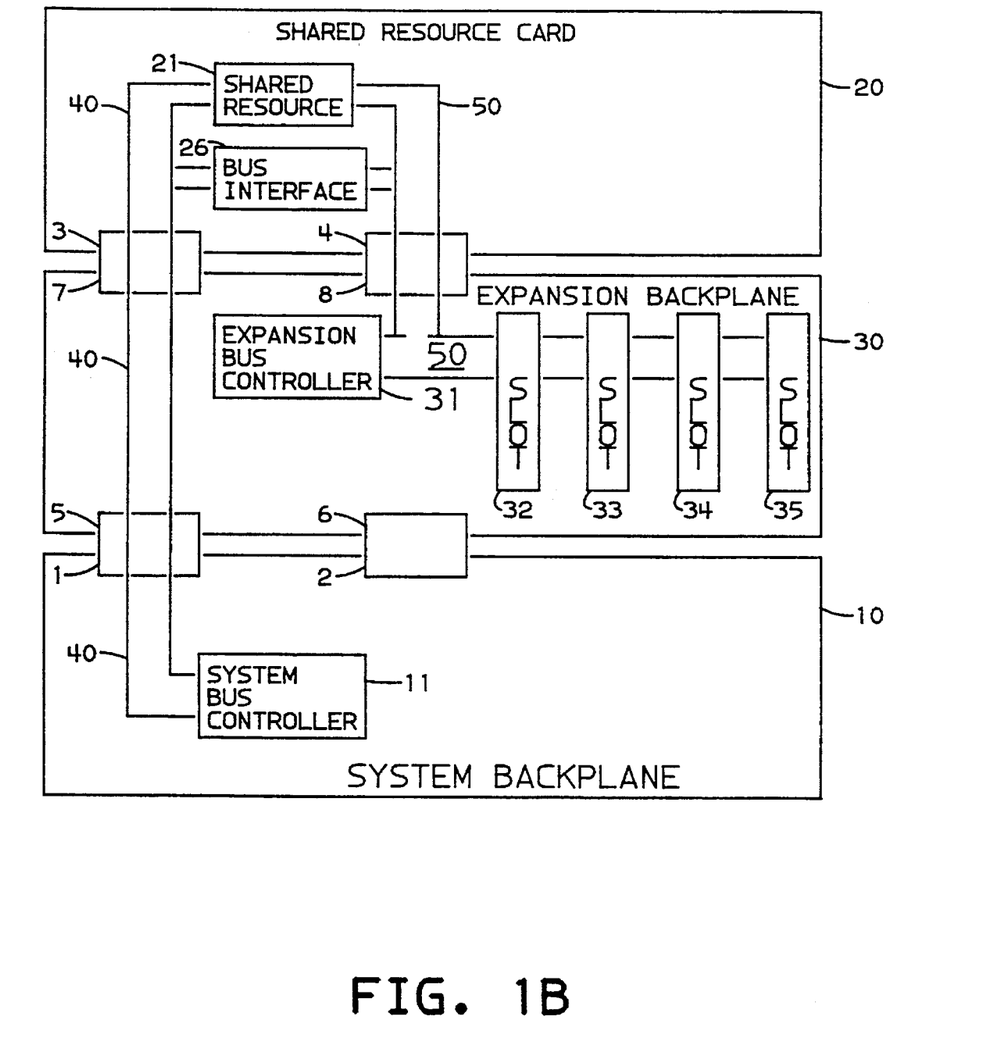
FIG. 1B shows a functional block diagram of the advanced level computer system of the preferred embodiment.

FIG. 1B shows a functional block diagram of the advanced level computer system of the preferred embodiment. Expansion backplane 30 is now plugged into system backplane 10. Shared resource card 20 is now plugged into expansion backplane 30. Specifically, dual purpose connectors 1 and 2 on system backplane 10 mate with connectors 5 and 6, respectively, on expansion backplane 30. Also, connectors 3 and 4 of shared resource card 20 mate with connectors 7 and 8, respectively, on expansion backplane 30.

Expansion backplane 30 also contains expansion bus controller 31, and expansion slots 32–35. System bus 40 connects connector 5 with connector 7. Expansion bus 50 connects expansion bus controller 31 and slots 32–35 with shared resource 21 via connectors 4 and 8. Bus interface 26 on shared resource card 20 interfaces between system bus 40 and expansion bus 50. Although bus interface 26 is shown as physically residing on shared resource card 20, it could also reside on expansion backplane 30, or, as in the alternate embodiment, system backplane 10. Expansion cards needed by the user of the advanced system of FIG. 1B are plugged into expansion slots 32–35.

When the system services an expansion card in one of the expansion slots, data travels on system bus 40, through shared resource 21, through expansion bus 50 to the expansion card. Note that if system bus 40 is larger than the physical size of connectors 1, 3, 5, and 7, additional connectors can be employed. Likewise, if expansion bus 50 is larger than the physical size of connectors 2, 4, 6, and 8, additional connectors can be employed here as well.

Figure 2A:
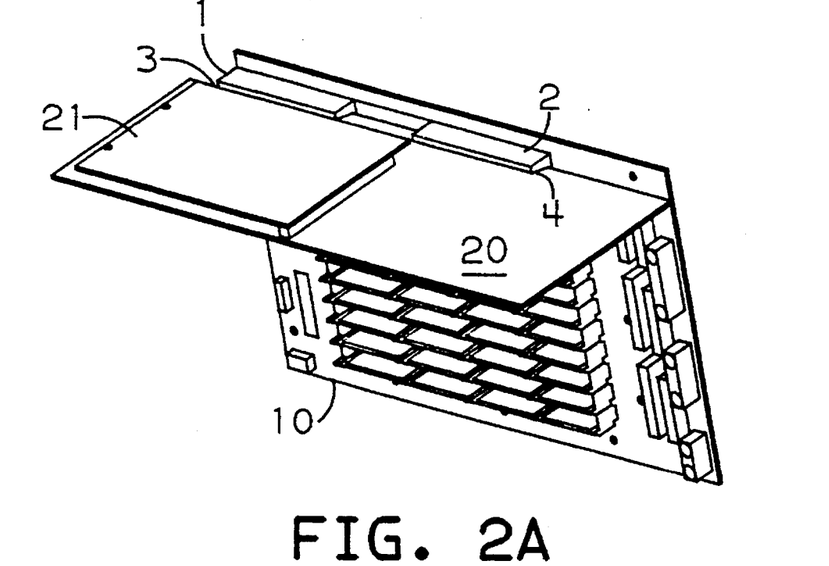
FIG. 2A shows a physical block diagram of the entry level computer system of the preferred embodiment.

FIG. 2A shows a physical block diagram of the entry level computer system of the preferred embodiment. In this configuration, system backplane 10 can be considered a "motherboard" and shared resource card 20 can be considered a "daughterboard". Although system backplane 10 and shared resource card 20 are shown in a perpendicular relationship, other spatial relationships are possible depending on the desired physical attributes of the system.

Figure 2B:
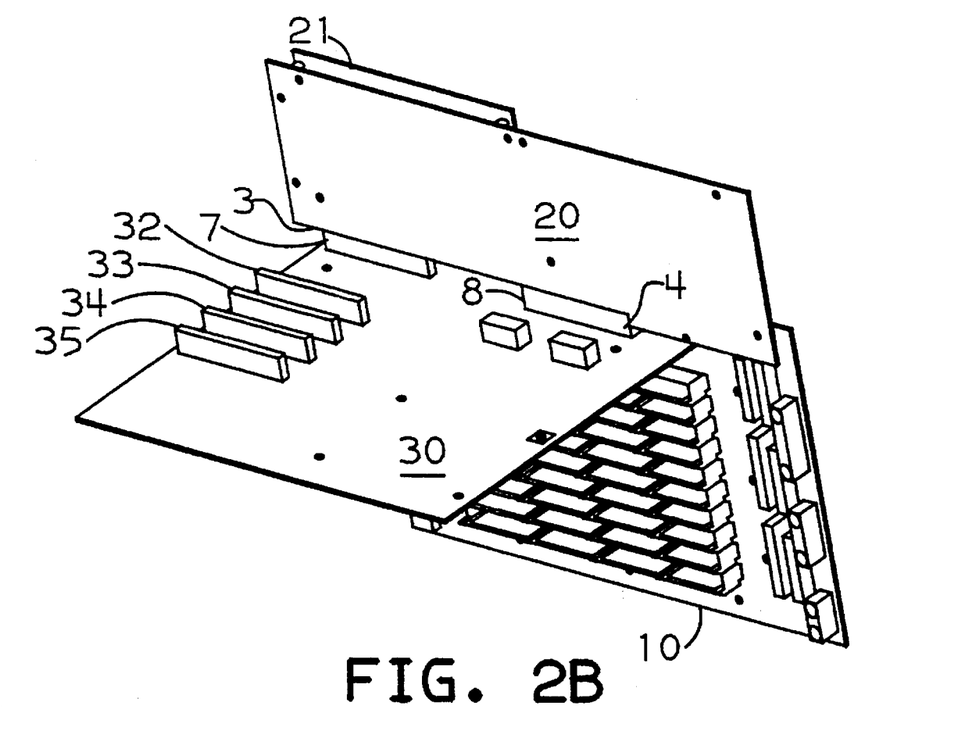
FIG. 2B shows a physical block diagram of the advanced level computer system of the preferred embodiment.

FIG. 2B shows a physical block diagram of the advanced level computer system of the preferred embodiment. In this configuration, system backplane 10 can be considered a "motherboard" expansion backplane 30 can be considered a "daughterboard" and shared resource card 20 can be considered a "granddaughterboard". Therefore, shared resource card 20 can be either a daughterboard or a granddaughterboard, depending on the configuration.

Although system backplane 10 is shown perpendicular to expansion backplane 30, which in turn is shown perpendicular to shared resource card 20, other spatial relationships are possible depending on the desired physical attributes of the system.

Figure 3A:
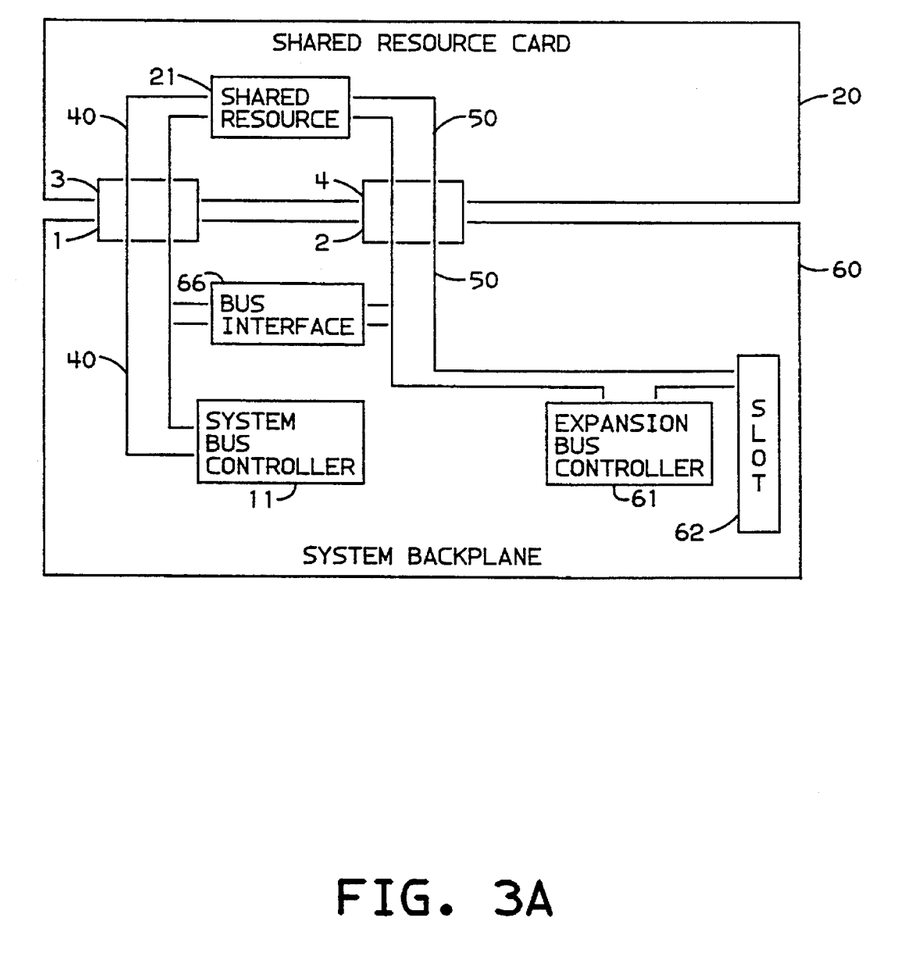
FIG. 3A shows a functional block diagram of the entry level computer system of the alternate embodiment.

FIG. 3A shows a functional block diagram of the entry level computer system of the alternate embodiment. System backplane 60 differs from system backplane 10 of the preferred embodiment in the addition of expansion bus controller 61, expansion slot 62 and bus interface 66. Expansion bus 50 connects shared resource 21 to expansion bus controller 61 and expansion slot 62. Bus interface 66 connects system bus 40 with expansion bus 50. Note that system backplane 60 contains the same basic function previously found in expansion backplane 30 and shared resource card 20 of the preferred embodiment, thereby providing for limited expandability on the system backplane at a tradeoff of increased cost.

Figure 3B:
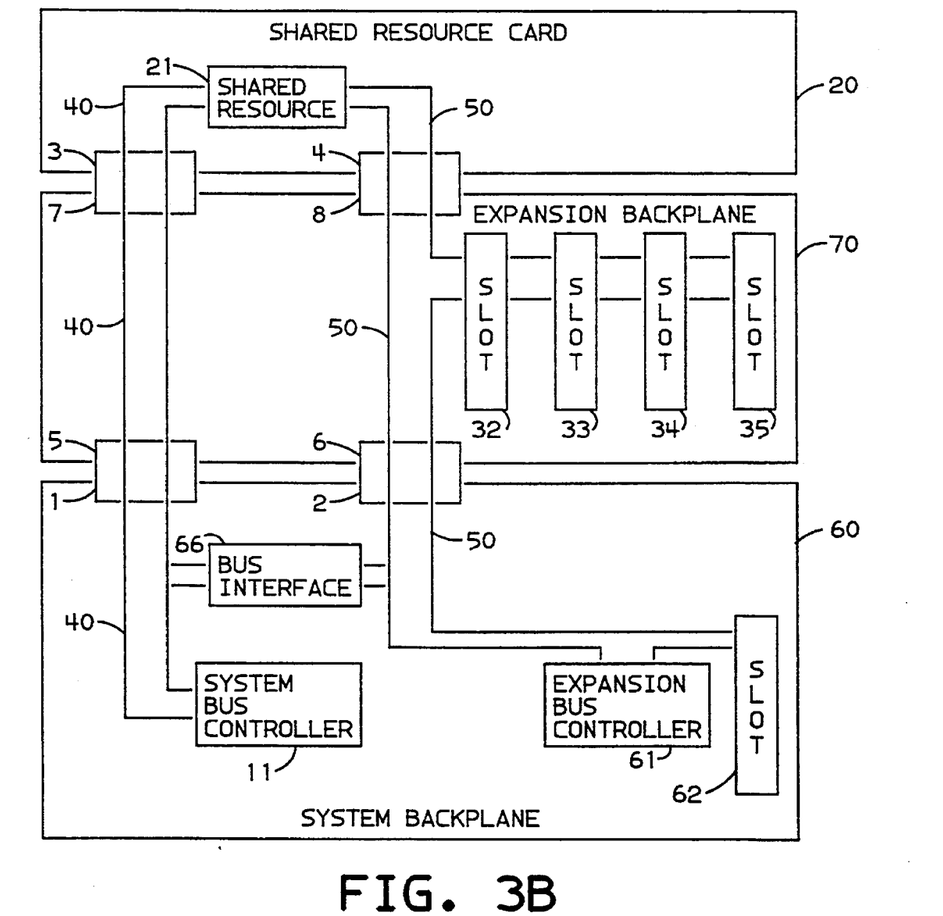
FIG. 3B shows a functional block diagram of the advanced level computer system of the alternate embodiment.

FIG. 3B shows a functional block diagram of the advanced level computer system of the alternate embodiment. Expansion backplane 70 is connected to system backplane 60. Shared resource card 20 is connected to expansion backplane 70. Expansion backplane 70 is similar to expansion backplane 30 of the preferred embodiment, except that expansion bus controller 31 was replaced by expansion bus controller 61 on system backplane 60.

While the invention has been described with respect to the preferred embodiment, it will be understood by those skilled in the art that various changes in detail may be made therein without departing from the spirit, scope and teaching of the invention. Accordingly, the herein disclosed is to be limited only as specified in the following claims.

What is claimed is:

1. A flexible computer system capable of being configured as an entry level system and capable of being upgraded from said entry level system to an advanced level system., said flexible computer system comprising:

a system backplane having a first connector and a second connector, said system backplane further comprising:

a system bus controller for controlling a system bus, and a system bus having a first segment thereof, said first segment of said system bus being connected between said first connector and said system bus controller;

a shared resource card having a third connector capable of mating with said first connector, and a fourth connector capable of mating with said second connector, said shared resource card further comprising:

a shared resource, and a second segment of said system bus, connected between said third connector and said shared resource;

wherein an entry level configuration of said flexible computer system comprises said system backplane and said shared resource card, said first connector being connected to said third connector and said second connector being connected to said fourth connector, said first and third connectors and said second and fourth connectors establishing a first communications path between said system backplane and said shared resource card, wherein said first communications path of said entry level configuration comprises said first segment of said system bus, wherein said first communications path of said entry level configuration comprises said second segment of said system bus, wherein said system backplane and said shared resources card in communication with each other via said first communications path comprise circuitry_ for supporting said entry level system; and an expansion backplane having a fifth connector capable of mating with said first connector, a sixth connector capable of mating with said second connector, a seventh connector capable of mating with said third connector, and an eighth connector capable of mating with said fourth connector, wherein an advanced level configuration of said flexible computer system comprises said system backplane, said shared resource card and said expansion backplane, said first connector being connected to said fifth connector and said second connector being connected to said sixth connector, said first and fifth connectors and said second and sixth connectors establishing a second communications path between said system backplane and said expansion backplane, said third connector being connected to said seventh connector and said fourth connector being connected to said eighth connector, said third and seventh connectors and said fourth and eighth connectors establishing a third communications path between said expansion backplane and said shared resource card, wherein said second communications path of said advanced level configuration comprises said first segment of said system bus, wherein said third communications path of said advanced level configuration comprises said second segment of said system bus, wherein said system backplane, said expansion backplane and said shared resource card, in communication with each other via said second and third communications paths, comprise circuitry for supporting said advanced level system, wherein said advanced level system further comprises a fourth communications path between said expansion backplane and said shared resource card, said fourth communications path comprising an expansion bus having a first segment thereof, said first segment of said expansion bus being connected between said shared resource and said fourth connector, wherein said shared resource card further comprises:

a bus interface, connected between said system bus and said expansion bus, for communicating between said system bus and said expansion bus.

2. The flexible computer system of claim 1, wherein said expansion backplane further comprises:

a third segment of said system bus connected between said fifth connector and said seventh connector, wherein said second communications path of said advanced level configuration comprises said third segment of said system bus, wherein said third communications path of said advanced level configuration comprises said third segment of said system bus, wherein said second communications path and said third communications path are connected together, forming a continuous communications path between said system bus controller and said shared resource;

an expansion bus controller for controlling said expansion bus;

a second segment of said expansion bus connected between said expansion bus controller and said eighth connector, wherein said fourth communications path of said advanced level configuration comprises said second segment of said expansion bus; and a first expansion slot, connected to said expansion bus, for connecting a first expansion card to said expansion bus.

3. The flexible computer system of claim 1, wherein said shared resource is memory.

4. A flexible computer system capable of being configured as an entry level system and capable of being upgraded from said entry level system to an advanced level system, said flexible computer system comprising:

a system backplane having a first connector and a second connector;

a shared resource card having a third connector capable of mating with said first connector, and a fourth connector capable of mating with said second connector, wherein an entry level configuration of said flexible computer system comprises said system backplane and said shared resource card, said first connector being connected to said third connector and said second connector being connected to said fourth connector, said first and third connectors and said second and fourth connectors establishing a first communications path between said system backplane and said shared resource card, wherein said system backplane and said shared resources card in communication with each other via said first communications path comprise circuitry for supporting said entry level system; and an expansion backplane having a fifth connector capable of mating with said first connector, a sixth connector capable of mating with said second connector, a seventh connector capable of mating with said third connector, and an eighth connector capable of mating with said fourth connector, wherein an advanced level configuration of said flexible computer system comprises said system backplane, said shared resource card and said expansion backplane, said first connector being connected to said fifth connector and said second connector being connected to said sixth connector, said first and fifth connectors and said second and sixth connectors establishing a second communications path between said system backplane and said expansion backplane, said third connector being connected to said seventh connector and said fourth connector being connected to said eighth connector, said third and seventh connectors and said fourth and eighth connectors establishing a third communications path between said expansion backplane and said shared resource card, wherein said system backplane, said expansion backplane and said shared resource card, in communication with each other via said second and third communications paths, comprise circuitry for supporting said advanced level system;

wherein said system backplane further comprises:

a system bus controller for controlling a system bus; and a system bus having a first segment thereof, said first segment of said system bus being connected between said first connector and said system bus controller, wherein said first communications path of said entry level configuration comprises said first segment of said system bus, wherein said second communications path of said advanced level configuration comprises said first segment of said system bus;

an expansion bus controller for controlling an expansion bus;

an expansion bus having a first segment thereof, said first segment of said expansion bus being connected between said second connector and said expansion bus controller, wherein said entry level configuration comprises a fourth communications path between said system backplane and said shared resource card through said second connector connected to said fourth connector, wherein said advanced level configuration comprises a fifth communications path between said system backplane and said expansion backplane through said second connector connected to said sixth connector; and a bus interface, connected to said expansion bus and said system bus, for communicating between said expansion bus and said system bus.

5. The flexible computer system of claim 4, wherein said shared resource card further comprises:

a shared resource;

a second segment of said system bus, connected between said third connector and said shared resource, wherein said first communications path of said entry level configuration comprises said second segment of said system bus, wherein said third communications path of said advanced level configuration comprises said second segment of said system bus; and a second segment of said expansion bus connected between said fourth connector and said shared resource, wherein said fourth communications path of said entry level configuration comprises said second segment of said expansion bus.

6. The flexible computer system of claim 5, wherein said expansion backplane further comprises:

a third segment of said system bus, connected between said fifth connector and said seventh connector, wherein said second communications path of said advanced level configuration comprises said third segment of said system bus, wherein said third communications path of said advanced level configuration comprises said third segment of said system bus, wherein in said advanced level configuration said second communications path and said third communications path are connected together, forming a continuous communications path between said system bus controller and said shared resource;

a third segment of said expansion bus connected between said sixth connector and said eighth connector, wherein said fifth communications path of said advanced level configuration comprises said third segment of said expansion bus, wherein in said advanced level configuration said fifth communications path comprises a continuous communications path between said expansion bus controller and said shared resource; and a first expansion slot, connected to said expansion bus, for connecting a first expansion card to said expansion bus.

7. The flexible computer system of claim 4, wherein said system backplane further comprises:

a second expansion slot, connected to said expansion bus, for connecting a second expansion card to said expansion bus.

8. An expansion backplane for a flexible computer system capable of being configured as an entry level system and capable of being upgraded from said entry level system to an advanced level system, said expansion backplane comprising:

a first pair of connectors capable of mating with a system backplane, comprising a first connector of said first pair and a second connector of said first pair;

a second pair of connectors capable of mating with a shared resource card, comprising a first connector of said second pair and a second connector of said second pair; and circuitry for supporting at least one additional function supported by said advanced level system but not supposed by said entry level system, wherein a first communications path is established between said system backplane and said expansion backplane when said first pair of connectors is connected to said system backplane, wherein a second communications path is established between said expansion backplane and said shared resource card when said second pair of connectors is connected to said shared resource card, wherein said system backplane, said expansion backplane and said shared resource card, in communication with each other via said first and second communications paths, comprise circuitry for supporting said advanced level system;

an expansion bus, connected to said first connector of said first pair of connectors and to said first connector of said second pair of connectors, for supporting communications with an expansion card;

a system bus, connected to said second connector of said first pair of connectors and to said second connector of said second pair of connectors, wherein said first communications path comprises a first portion of said system bus, wherein said second communications path comprises a second portion of said system bus, wherein said first communications path and said second communications path are connected together, forming a continuous communications path between a system bus controller on said system backplane and said shared resource; and an expansion slot, connected to said expansion bus, for connecting an expansion card to said expansion bus.

9. An expansion backplane for a flexible computer system capable of being configured as an entry level system and capable of being upgraded from said entry level system to an advanced level system, said expansion backplane comprising:

a first pair of connectors capable of mating with a system backplane, comprising a first connector of said first pair and a second connector of said first pair;

a second pair of connectors capable of mating with a shared resource card, comprising a first connector of said second pair and a second connector of said second pair; and circuitry for supporting at least one additional function supported by said advanced level system but not supported by said entry level system, wherein a first communications path is established between said system backplane and said expansion backplane when said first pair of connectors is connected to said system backplane, wherein a second communications path is established between said expansion backplane and said shared resource card when said second pair of connectors is connected to said shared resource card, wherein said system backplane, said expansion backplane and said shared resource card, in communication with each other via said first and second communications paths, comprise circuitry for supporting said advanced level system;

an expansion bus controller for controlling an expansion bus;

an expansion bus, connected to said expansion bus controller and to said first connector of said second pair of connectors, for supporting communications with an expansion card;

a system bus, connected to said second connector of said first pair of connectors and to said second connector of said second pair of connectors, wherein said first communications path comprises a first portion of said system bus, wherein said second communications path comprises a second portion of said system bus, wherein said first communications path and said second communications path are connected together, forming a continuous communications path between said system bus controller and said shared resource; and an expansion slot, connected to said expansion bus, for connecting an expansion card to said expansion bus.

10. A flexible computer system capable of being configured as an entry level system and capable of being upgraded from said entry level system to an advanced level system, said flexible computer system comprising:

a system backplane having a first connector, said system backplane further comprising:
(a) a system bus controller for controlling a system bus, and
(b) a first segment of a system bus, said first segment of said system bus being connected between said first connector and said system bus controller;

a shared resource card having a second connector capable of mating with said first connector, wherein an entry level configuration of said flexible computer system comprises said system backplane and said shared resource card, said first connector being coupled to said second connector, said first and second connectors establishing a first communications path between said system backplane and said shared resource card, wherein said system backplane and said shared resources card in communication with each other via said first communications path comprise circuitry for supporting said entry level system; and an expansion backplane having a third connector capable of mating with said first connector, and a fourth connector capable of mating with said second connector, said expansion backplane further comprising:
(a) a first portion of an expansion bus, and
(b) a plurality of expansion slots for insertion of expansion boards, said expansion slots being connected to said expansion bus;

wherein an advanced level configuration of said flexible computer system comprises said system backplane, said shared resource card and said expansion backplane, said first connector being connected to said third connector, said first and third connectors establishing a second communications path between said system backplane and said expansion backplane, said fourth connector being connected to said second connector, said fourth and second connectors establishing a third communications path between said expansion backplane and said shared resource card, and wherein said advanced level configuration further comprises an expansion bus controller for controlling communications on said expansion bus, wherein said system backplane, said expansion backplane and said shared resource card, in communication with each other via said second and third communications paths, comprise circuitry for supporting said advanced level system, wherein said first communications path of said entry level configuration comprises said first segment of said system bus, wherein said second communications path of said advanced level configuration comprises said first segment of said system bus.

11. The flexible computer system of claim 10, wherein said shared resource card further comprises:

a shared resource; and a second segment of said system bus, connected between said second connector and said shared resource, wherein said first communications path of said entry level configuration comprises said second segment of said system bus, wherein said third communications path of said advanced level configuration comprises said second segment of said system bus.

* * * * *

UNITED STATES PATENT AND TRADEMARK OFFICE
CERTIFICATE OF CORRECTION

PATENT NO. : 5,517,623

DATED : May 14, 1996

INVENTOR(S) : Anthony E. Farrell, Randall J. Fuhrman, Kenneth K. Gerzsenyi, and John L. Regehr It is certified that error appears in the above-identified patent and that said Letters Patent is hereby corrected as shown below:

On the title page, item [63], and in col. 1, lines 4 and 5:

"Continuation of Ser. No. 190,730, Dec. 13, 1990, abandoned." should be --Continuation of Ser. No. 190,730, May 5, 1988, abandoned.--

Signed and Sealed this

Seventeenth Day of September, 1996

Attest:

BRUCE LEHMAN

*Attesting Officer*        *Commissioner of Patents and Trademarks*